(12) United States Patent  
Vandelac

(10) Patent No.: US 6,301,132 B1
(45) Date of Patent: Oct. 9, 2001

(54) COMPACT FAST BATTERY CHARGER

(75) Inventor: Jean-Pierre Vandelac, Montreal (CA)

(73) Assignee: Primetech Electronics, Inc., Dollard-des-Ormeaux (CA)

( * ) Notice: Subject to any disclaimer, the term of this patent is extended or adjusted under 35 U.S.C. 154(b) by 0 days.

(21) Appl. No.: 09/704,079

(22) Filed: Nov. 1, 2000

Related U.S. Application Data

(62) Division of application No. 09/325,156, filed on Jun. 3, 1999, now Pat. No. 6,172,480.
(60) Provisional application No. 60/105,402, filed on Oct. 23, 1998.

(51) Int. Cl.[7] ................................................. H02H 7/122
(52) U.S. Cl. ................................. 363/56.01; 363/56.09; 363/56.12; 323/908
(58) Field of Search ............................... 363/16, 18, 19, 363/20, 21.01, 55, 56.01, 56.09, 56.1, 56.11, 56.12; 323/901, 908

(56) References Cited

U.S. PATENT DOCUMENTS 4,323,961 * 4/1982 Josephson .................... 363/56.11 X
5,196,780    3/1993  Pacholok .
5,319,298    6/1994  Wanzong et al. .
5,680,031   10/1997  Pavlovic et al. .
5,777,862 *  7/1998  Williams et al. ................. 363/56.01
5,859,524    1/1999  Ettes .

* cited by examiner

Primary Examiner—Jessica Han
(74) Attorney, Agent, or Firm—Kudirka & Jobse LLP

(57) ABSTRACT

A compact, economical and fast battery charger for Ni-CAD and Ni-MH batteries turns a current source into a controlled voltage source which keys off a signal representative of the voltage level of the battery during the charging process and turns the current source ON and OFF to assure that the battery during the charging process does not exceed a given voltage level. The apparatus includes in par a ballasting resistor in series with the battery to compensate for the low resistance of the battery and an open collector voltage comparator which establishes high and low voltage set points for turning the current source ON and OFF at the appropriate times. The method and apparatus includes a visual display responsive to a signal which produces on the visual display an indication of the state of charge of the battery during a charging cycle. A circuit board has a long U-shaped trace extending around a notch in the board, on each side of each is mounted on battery. The printed circuit board has a trimming resistor arrangement which allows for trimming to be done using a drill.

1 Claim, 11 Drawing Sheets

COMPACT FAST BATTERY CHARGER

This application claims priority of U.S. Provisional Patent Application 60/105,402 filed Oct. 23, 1998, and is a divisional of U.S. Patent application Ser. No. 09/325,156, which was filed on Jun. 3, 1999 now U.S. Pat. No. 6,172,480.

FIELD OF THE INVENTION

The present invention relates to charging batteries in a fast and efficient manner. More particularly, it relates to charging sealed nickel-cadmium (Ni-CAD) and nickel-metal hydride (Ni-MH) batteries with a method and apparatus which operate quickly, efficiently and economically.

BACKGROUND OF THE INVENTION

A number of reasonably effective methods and related apparatuses exist for charging sealed Ni-CAD and Ni-MH batteries. Fast charging of Ni-CAD and Ni-MH batteries is usually performed with a multiple level current source that is controlled by sophisticated mechanisms. These mechanisms work on various schemes including keying off variations in the temperature as well as methods which employ ratios which work off changes in the voltage with respect to time, such as the ratio $-\Delta V/\Delta t$ or changes in the temperature such as $\Delta T/\Delta t$ schemes. The mechanisms are generally implemented through integrated circuits. The cost of these integrated circuits are prohibitive for many applications in consumer products. In addition, most of the available integrated circuits require an external 3 to 5-volt supply. For autonomous dual cell systems, battery voltage can be as low as 2 volts; therefore, a control circuit which overcomes this problem would have to be included.

However, all of these methods and the current apparatuses available have substantial expenses related to their implementation in relation to many of the potential applications for which they can be used. Additionally, many of the devices and circuitry necessary to implement these complex charging schemes lack the compactness needed for their prospective applications.

Thus, the problem of developing a useable method and apparatus which will recharge Ni-CAD and Ni-MH batteries in a relatively quick, efficient and economical manner through use of a compact apparatus has existed for quite some time. Ni-CAD and Ni-MH batteries are generally readily available and have a wide variety of applications. Many applications for their use involve relatively small hand-held electronic devices in which size and cost represent crucial factors in their design. Such devices include hand-held electric razors and similar consumer devices.

Voltage termination of fast-charge current is a potentially less expensive alternative, but charge termination based on voltage sensing is not recommended by battery manufacturers because of the very low resistance of these cells. Charging a battery with a voltage source set too high would result in large currents that would overcharge, damage and perhaps destroy the battery. In addition, Ni-MH and Ni-CAD cells have negative voltage temperature coefficients. In overcharge, the battery heats up and its voltage decreases, making the problem even less manageable. Lead-acid car batteries, vented Ni-CAD and similar batteries used in industrial applications, because of their differing characteristics, are quite amenable to voltage sensing. However, these types of batteries are ill-suited for use in small consumer products.

One attempt to solve many of these problems is illustrated in FIG. 1. Power bipolar transistor (1) in combination with windings (2) and (3) and Schottky diode (4) is used to transfer energy from the input voltage source (5) to the two battery cells (6) and (7). Current sense resistor (8) in combination with biasing-circuitry/DC-offset circuitry (9) and base-drive transistor (10) ensure that the rate of transfer of energy is limited. Base-drive-supply circuit (11) completes the fast rate charger.

The fast rate charge is interrupted through the use of transistor (12) and the voltage dividing elements consisting of trimming resistors (13) dividing resistors (14), diodes (15), (16), base-drive transistor (10) and Schottky diode (4). When biased sufficiently transistor (12) keeps transistor (10) ON thus preventing transfer of energy through transistor (1). The operation of the circuit results in the waveform of FIG. 2.

The above circuit has two very serious deficiencies. First, the battery voltage at which fast charge interruption will occur can vary considerably from one manufactured unit to the next. This is due to the parameter variances of the the multitude of components in the dividing circuits. It also is caused by the effect of the biasing-circuitry/DC-offset circuitry (9) and of the base-drive-supply circuit (11) and the base current required to turn off transistor (1). Second, the circuit resistance between the energy delivering circuit and battery cells (6) and (7) is very low. Since the effect of transistor (12) is to effectively regulate the battery voltage, voltage adjustment must be very accurate in order to avoid overcharging of the battery.

In an attempt to solve these problems, the circuit of FIG. 1 uses an intricate network of trimming resistors (13). However, this scheme requires that 100% of the unit will have to be trimmed. Thus, this solution creates its own significant problems. Accurately determining which resistors to trim is very difficult and may even require a two step trimming procedure. In addition, trimming is perform by manually cutting the tracks, a very undesirable feature for a product which must be mass produced.

The circuit of FIG. 1 also has another undesirable feature, whenever the battery is fully or nearly fully charged, the power supply completely stops for long period of time as shown in FIG. 2. A visual indicator, not shown on FIG. 1, is then turned off. Although the unit is still connected to the voltage source (5), there is no visual indication that the unit is working. It would be desirable to always have an indication that the power supply is functional and also, if possible, that the visual indicator should indicate in some manner the state of charge of the battery when charging.

Thus, a need exists for a fast, efficient and economical way to recharge sealed Ni-CAD and Ni-MH batteries. In particular, one that can adapt the use of a voltage termination and sensing technique and do so in an economical and efficient manner. A method and apparatus that will charge with a voltage sensing method and apparatus Ni-CAD and Ni-MH batteries, while overcoming the three major problems associated with this technique, namely: low resistance between the batteries, negative temperature coefficients of the batteries and voltage source setting.

SUMMARY OF THE INVENTION

It is an object of the present invention to provide a method and apparatus to quickly and efficiently charge sealed Ni-Cad and Ni-MH batteries (as well as other batteries having similar charging characteristics).

It is a further object to provide a method and apparatus for charging sealed Ni-Cad and Ni-MH batteries which is economical and easy to implement and manufacture.

It is yet another object of the present invention to provide a compact apparatus for charging a battery cell.

It is yet another object of the present invention to provide a method and apparatus which can charge sealed Ni-Cad or Ni-MH with voltage sensing and overcome the difficulties associated with this technique.

It is yet another object of the present invention to provide the capability of indicating the state of charge or discharge of a battery at any time through use of a visual indicator.

To accomplish these and other objectives, the present invention provides an apparatus for the fast charging of one or more series connected Ni-Cad or Ni-MH batteries using voltage sensing, which apparatus has: A current source controlled by a control signal to turn on and off a supply of current to the one or more battery cells being charged; a voltage controlled circuit for sensing a voltage across the one or more battery cells being charged and for controlling the current source and wherein the voltage controlled circuit determines when the one or more battery cells have reached a high voltage set point to control the current source to interrupt said supply of current, and when the voltage controlled circuit determines when the one or more batteries have fallen to a low voltage set point to control said current source to restore said supply of current, and wherein the voltage controlled circuit cycles through a process of charging the one or more batteries until the high voltage set point is reached and then suspends charging until the low voltage set point is reached and then continuously repeating the cycle so that the one or more batteries will reach and maintain a sustained voltage equivalent to the low voltage set point. The apparatus of the present invention generally begins a charging cycle with a maximum duty cycle for fast charging, continues with a progressively smaller duty cycle for taper charging and ends the charging cycle with a minimum duty cycle for trickle charging. Thus, the scheme of using a current source in conjunction with a voltage sensing scheme in effect turns the current source into a voltage source.

In one aspect of the present invention, it provides a visual indicator associated with the voltage controlled circuit to provide a variable indication of a rate of charge of the one or more batteries during the charging process. This degree of charge may be indicated by an LED or other light source by its rate of blinking depending on the stage of the charging process. The LED is on at all times during the initial stages of the charging process when the battery is undergoing a fast charge and the LED thereafter blinks at a progressively slower rate until the trickle charge phase is reached. In another aspect of the present invention, the function of the visual indicator which is controlled by a pulsed signal can be adjusted by the addition of circuit components, such as one or more capacitors to vary the pulse width of the signals which turn the visual indicator off and on and thus vary its appearance to one using the device. In an additional aspect of this invention, it includes a resistor which connects the base of one of the transistors of the comparator with a collector of the other transistor of the comparator so the comparator can sense high and low set points.

In another aspect of the present invention it provides a variable indication which is a variation in a visually perceptible flashing pattern of the LED wherein the LED is fully on in the fast charging state, in the taper charging state the LED duty cycle continuously shortens and its period lengthens when approaching the trickle charging state and in the trickle charging state the duty cycle is at a minimum and the period is longest. In yet another aspect of the invention the LED is first inverted to indicate the state of charge rather than the rate of charge.

In another aspect of the present invention, the voltage controlled circuit uses a two transistor comparator to sense the high and low voltage set points and to turn the current source on and off.

In yet another aspect of the present invention, a ballasting resistor is added in series with the one or more batteries being charged. This compensates for the low resistance of the batteries.

In another aspect of the present invention it provides a printed circuit board (PCB) for a handheld electronic device designed for ease of manufacture and use. The PCB has a U shaped board with a first and second leg. There is a mount for a battery on each legs and a conductive trace on a perimeter of the U-shape of the board interconnecting the mount of the first leg to the mount of the second leg for introducing a ballasting resistance in series with the batteries. This trace can also be fabricated to include a fuse trace.

According to a further aspect of the present invention, the PCB is also constructed with the ability to vary resistance in a circuit on the board with an automated trimming technique. In this variation, round conduits or apertures have been made in the board. The apertures are located in conducting strips. The conducting strips interconnect resistors into circuits on the PCB. The apertures act as guides for a cutting device such as a drill which when inserted into the apertures severs the connection of the resistor from the circuit, thereby removing a predetermined amount of resistance from the circuit.

In a further aspect of the present invention, it provides a printed circuit board (PCB) for a handheld electronic device designed for ease of manufacture and use. This PCB has a first section for holding surface mounted components and a second section for holding through hole mounted components. The first section and second section are configured such that the surface mounted components can be soldered with reflow techniques on the first section and the through hole components can be soldered using wave techniques on the second section.

In another aspect of this invention it provides a current source of the astable type for limiting an output current under overload conditions. The current source includes a power MOSFET, the drain of which is connected to a first terminal of a primary winding of a transformer; the MOSFET's source is connected to a first connector of a current sense network; and the MOSFET's gate is connected to: a cathode of a Zener diode, a first terminal of a trigger resistor, a first connector of an energy transfer limiting network and a collector of a bipolar npn transistor. In turn, the trigger resistor has a second terminal connected to a second terminal of the primary winding the transformer and a voltage source. The voltage source has a cathode connected to a first terminal of a single winding, an emitter of the bipolar npn transistor, a second connector of the current sense network and an anode of the Zener diode. The single winding has a second terminal which connects to a second connector of the energy transfer limiting network, a first terminal of an input voltage compensation resistor. The input voltage compensation resistor has a second terminal which connects to the base of the bipolar npn transistor and to a third connector of the current sense network. The transformer has a secondary winding the first terminal of which connects to the anode of a Schottky diode.

The energy transfer limiting network includes a diode and first resistor in parallel. The energy transfer limiting network includes a capacitor with a first terminal which forms the second connector of the energy transfer limiting network and a second terminal which attaches it in series with the diode and the first resistor by attaching to a first terminal of each. A second resistor has a first terminal which attaches to a second terminal of the diode. The second resistor has a second terminal which attaches to a second terminal of the first resistor which connection of the two also forms the first connector of the energy transfer limiting network. The energy transfer limiting network limits the amount of energy delivered to the gate circuit composed of 21A, 35 and 30. In this preferred implementation it also reduces the transfer of energy from the primary winding to the secondary winding under overload conditions.

The current sense network has a first and second resistor and a capacitor, the first and second resistor each have a first terminal which attach to each other and form the first connector of the current sense network; the capacitor has a first terminal which attaches to a second terminal of the first resistor, which form together the second connector of the current sensing network; and the capacitor has a second terminal which attaches to a second terminal of the second resistor which form together the third connector of the current sense network.

BRIEF DESCRIPTION OF THE DRAWINGS

The invention will be better understood by an examination of the following description, together with the accompanying drawings, in which:

FIG. 8a depicts a portion of a PCB where a trimming aperture has been drilled out to sever a connection.

DETAILED DESCRIPTION OF THE PREFERRED EMBODIMENT

Figure 1:
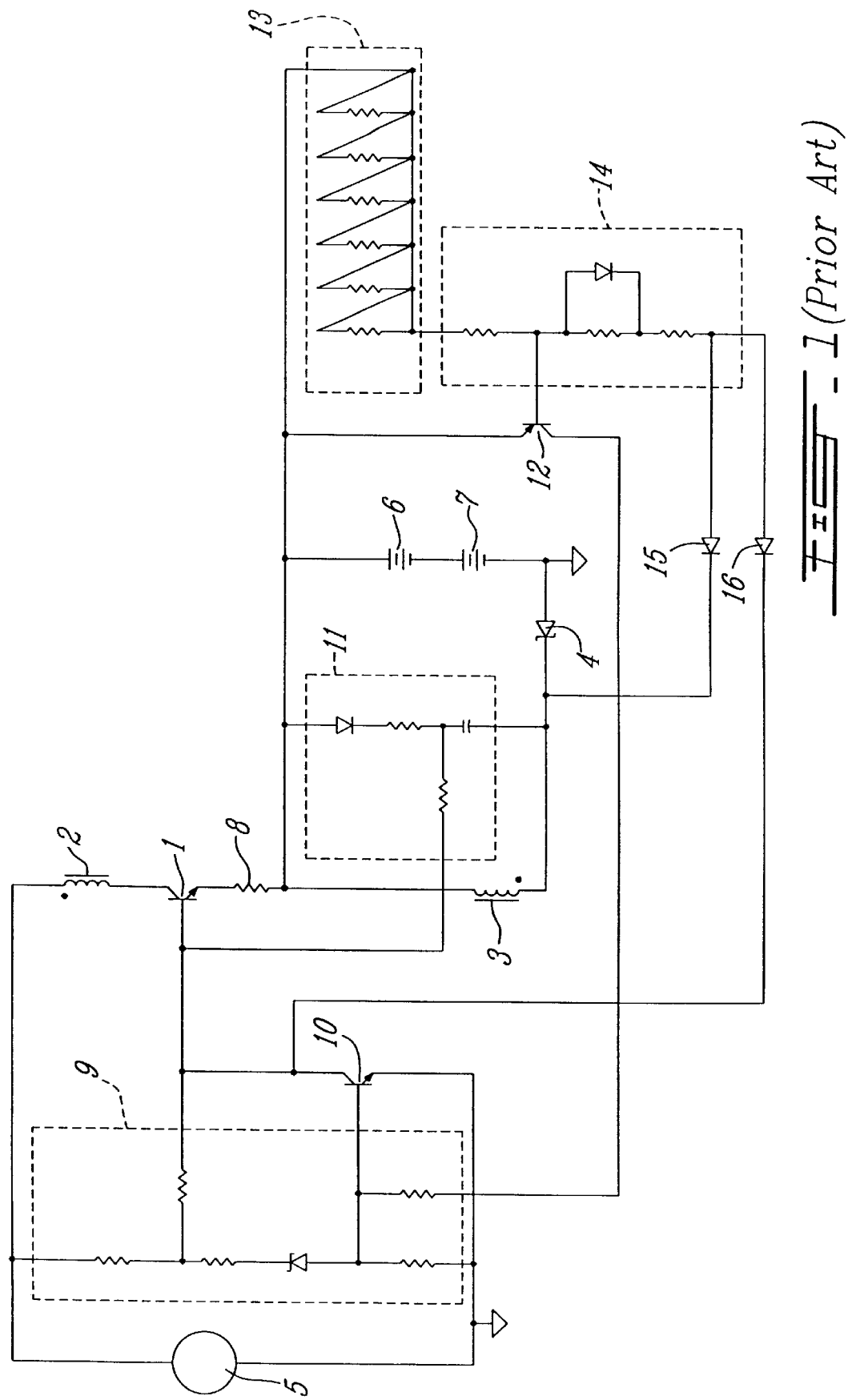
FIG. 1 is a schematic of a prior art circuit.
Figure 2:
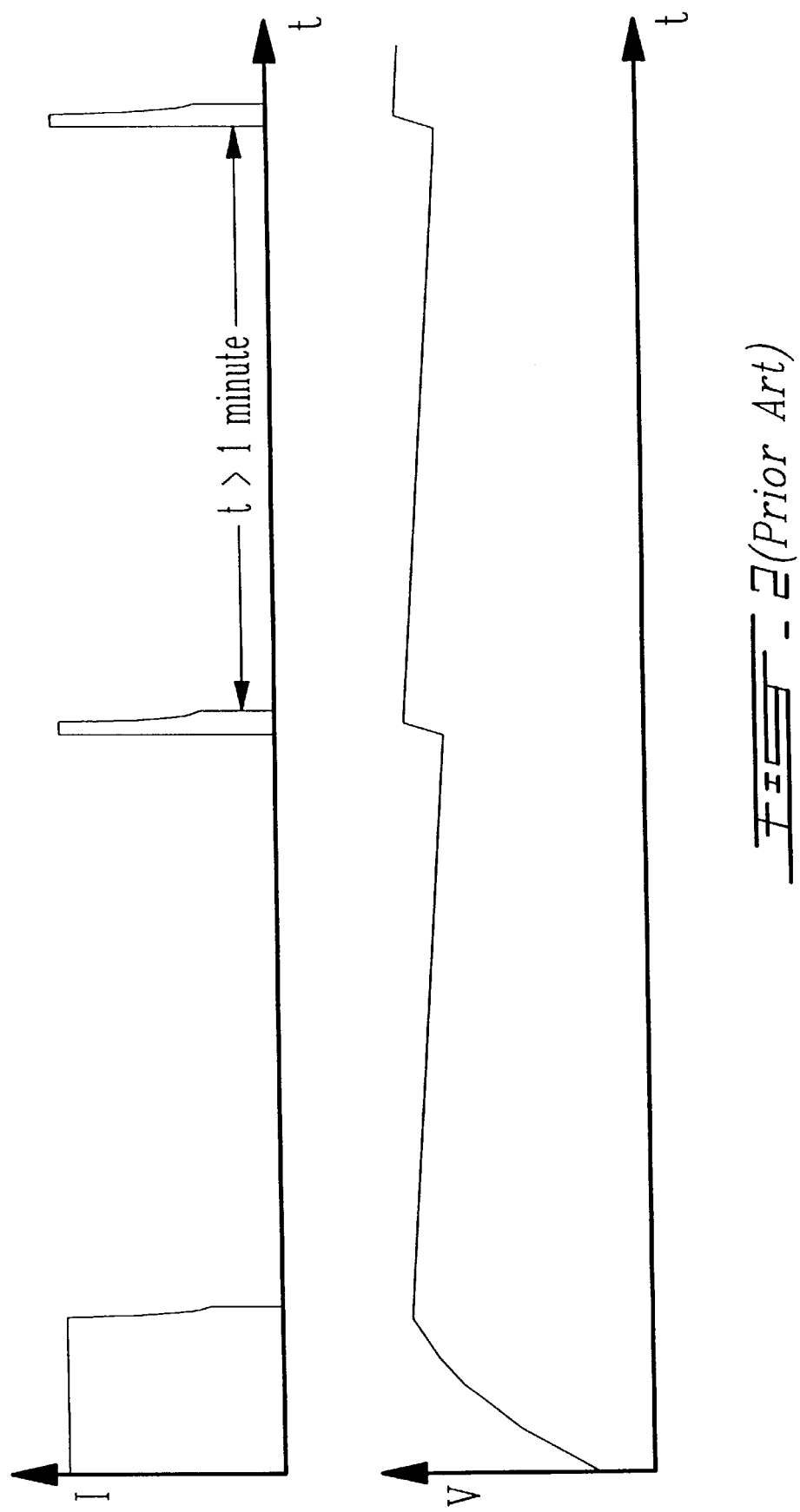
FIG. 2 is a voltage and current timing diagrams of the prior art circuit depicted in FIG. 1.

1. Detailed Overview of the Operation of the Invention

FIGS. 3a and 3b depict the overall method of the present invention. The following example relates to a two cell battery, but the concepts are readily adaptable to other configurations of battery cells. FIGS. 3a and 3b depict a time graph of the voltage and current characteristics of a battery and charging circuit during the charging cycles of a battery using the method and apparatus of the present invention. When the charging of the battery commences, assuming the battery is completely or almost completely discharged, an initial fast charging state 81 occurs which lasts typically from 5 to 45 minutes. During this fast charging period, the current as depicted in FIG. 3b goes ON at 80 and remains ON until the voltage in the battery reaches the predetermined set point of 2.97 volts 83 as depicted in FIG. 3a. Thus, during the first fast charging phase as depicted in FIGS. 3a and 3b, when the current turns ON, the voltage gradually rises from 2.6 volts to 2.97 volts, at which point the current turns OFF. The invention as described below provides the necessary circuitry to elicit this response. The current will then turn back ON when the voltage falls to a predetermined level of 2.83 volts and will remain ON until the voltage of the battery reaches the preset maximum voltage of 2.97 volts. Thus, as depicted in FIGS. 3a and 3b, this process of charging the battery, which consists of a current pulse charging scheme has an initial fast charging mode, a subsequent taper charging mode and then a trickle charging mode which continues indefinitely. As depicted, the current turns ON at various time periods in pulses upon sensing that the voltage of the battery has dropped below the predetermined minimum point of 2.83 and remains ON until the voltage reaches 2.97 at which point it turns OFF. This process then continues indefinitely. As depicted in FIGS. 3a and 3b, the pulses reduce in width and become less frequent with the passing of time. The process of the present invention thus relies on a combined method of frequency and pulse-width modulation.

FIGS. 3a and 3b are only provided to illustrate the concepts described herein. The vertical and horizontal scales are highly distorted in order to emphasize the important detail. For example, fast charging time lasts for several minutes; whereas, the current pulses generated during the taper charge period following the fast charging are much more numerous than illustrated and their duration much shorter. Additionally, in the trickle charging period following the taper charging period the pulses become much further apart in time. As an example, in the preferred embodiment the length of the pulses during the trickle charge phase is less than 100 milli-seconds. In addition, in the preferred embodiment, each current pulse is in fact composed of much shorter current pulses. The "sub-pulse" period is variable and of the order of 50 micro-seconds. The average of the "sub-pulses" is approximately 1.2 Ampere when the current source is on. This average current is somewhat dependent on many parameters like output voltage, temperature and others. Also, some slopes of the voltage waveform are greatly exaggerated. For instance in FIG. 3a the voltage between the last two current pulses if drawn to scale would appear flat.

Also, with a detector strictly based on voltage, the period between pulse would, in practice, be random. To create pulses which in a fairly predictable manner become shorter and regularly spaced in time, capacitors are added to the voltage measurement circuit. The output voltage is thus integrated before the voltage detector can make a decision. Addition of these capacitors allows the selection of circuit parameters which result in the generation of pulses with the desired period as indicated elsewhere in this text. FIG. 3a illustrates the effect of addition of the capacitors where upon careful examination it will be noted that the turn-OFF of the current source generally occurs for an output voltage greater than the predetermined set point of 2.97V and turn-ON occurs generally occurs for an output voltage lower than the predetermined set point 2.83V. However, for simplicity of the discussion herein it is assumed that turn-ON occurs when the output voltage reaches the predetermined low set point and turn-OFF occurs when the output voltage reaches the predetermined high set point. In addition, it must be noted that all numerical information given throughout this text is for the purpose of illustration only. One skilled in the art could build or design systems with other settings without deviating from the spirit of the invention.

Figure 3:
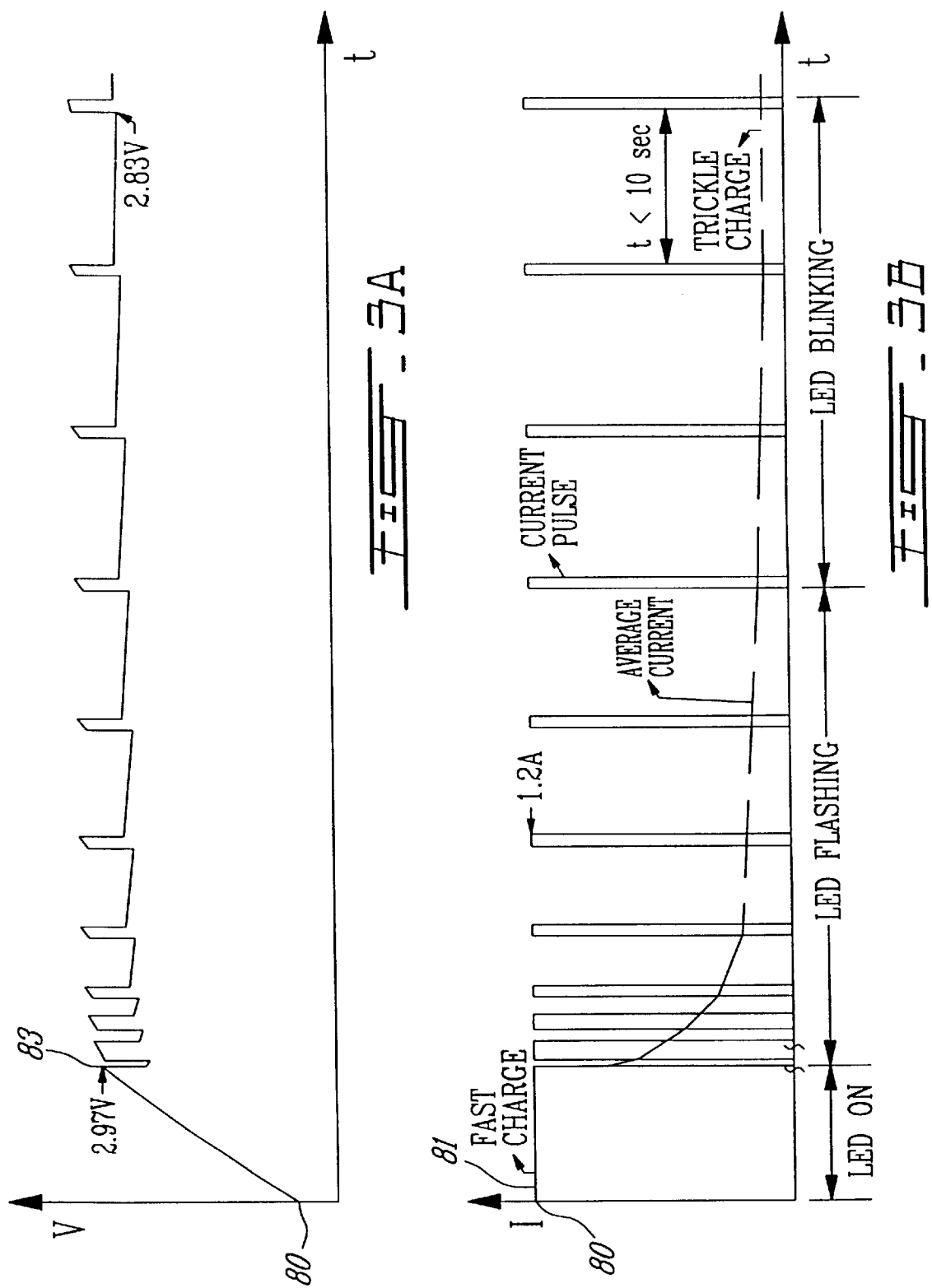
FIG. 3a is a graph of the battery voltage characteristics over time of a battery during recharging using the method and apparatus of the present invention.
FIG. 3b is a graph of the current characteristics over time synchronous with FIG. 3b during the recharging of a battery using the present invention.
Figure 4:
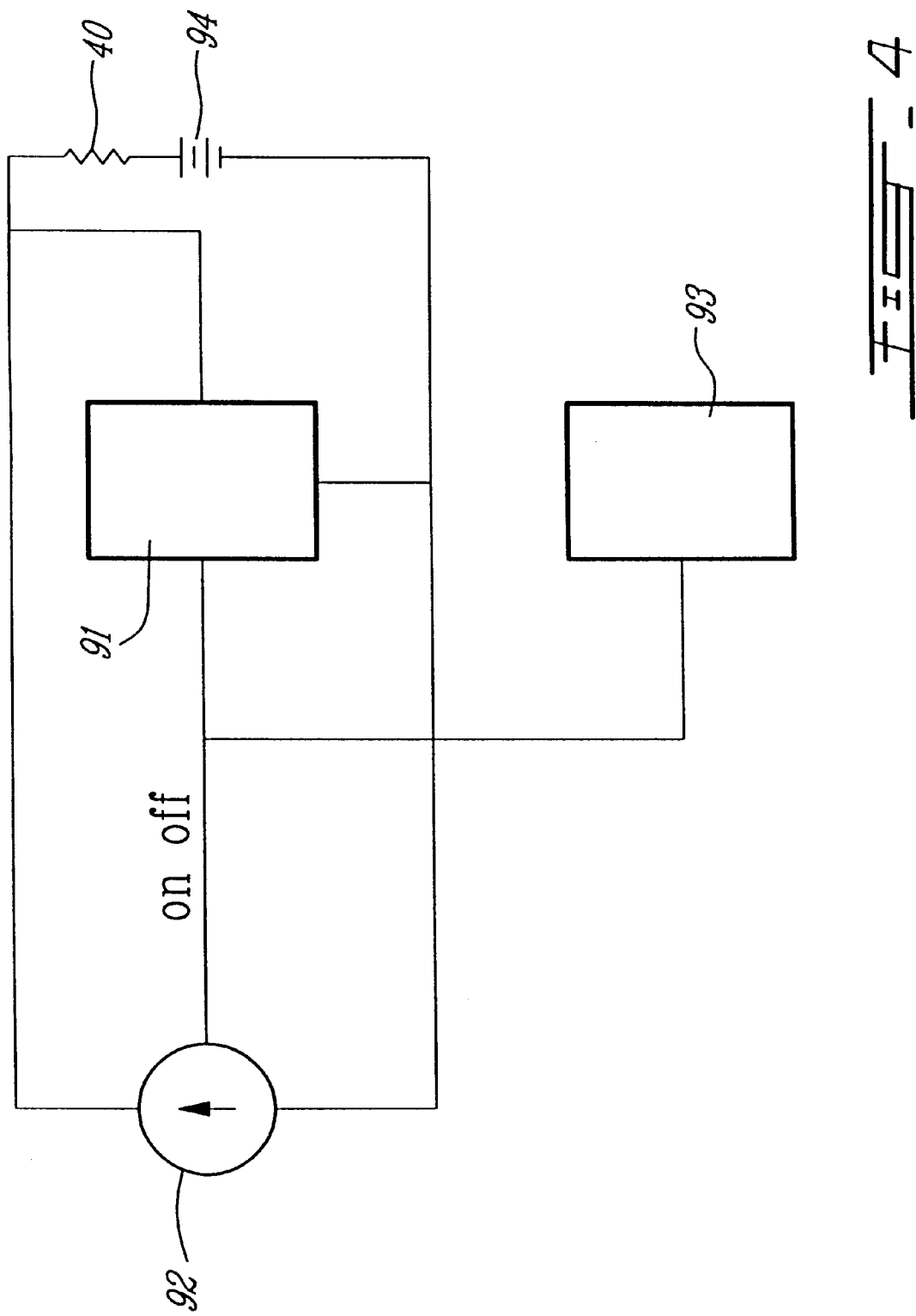
FIG. 4 is a schematic block diagram which depicts the major functional components of the present invention.

FIG. 4 provides a very simple overall schematic diagram of the basic functional divisions of the invention together with some of the key discrete elements. Current source 92 connects to the batteries 94. Voltage controlled circuit 91 senses the voltage in the batteries and in the preferred embodiment, turns the current source ON and OFF during the charging process as depicted in FIGS. 3a and 3b. The voltage controlled circuit 91 turns ON the current source when the voltage falls below 2.83 volts in the preferred embodiment and turns the current source 92 OFF when the voltage rises to 2.97 volts. Resistor 40 acts as a ballasting or compensating resistor for batteries 94.

In the preferred embodiment, generally two batteries will be charged. Additionally, the invention can include a visual display 93 of FIG. 4 which indicates to the user, of the generally hand-held device, the point in the recharging sequence that the system is at, such as the beginning, middle or end. In the preferred embodiment, as will be explained in more detail below, the visual display is a light emitting diode (LED) which is ON continuously during the initial phase of charging; during the middle phase the LED blinks quickly then progressively slower and as the charging sequence approaches the end of fully charging the battery, the LED blinking rate stabilizes to a final rate.

2. Detailed Description of Various Components

The balance of this description will provide a detailed statement of the key components of the present invention as they would be implemented in the preferred embodiment. In reviewing the descriptions of the components, those skilled in the art will appreciate that some of these features can, on their own, accomplish some, if not all, of the objects of the present invention. However, those skilled in the art will also realize on reviewing the following description that each component described when used together with the others not only accomplish all the objects of the present invention but do so as a harmoniously integrated whole.

A. Creation of a Reliable Voltage Source

The present invention adopts a constant current source and turns it, at 80 of FIGS. 3A and B, into a voltage source. It does so by keying off the voltage sensed at the output of the current source and thus turns the current source ON and OFF during the battery charging process. To be most effective, the procedure must create a precise voltage source. However, creation of a precise voltage source would be an expensive proposition. To avoid this expense and still achieve the desired results the invention includes a ballasting resistor 40 of FIGS. 4 and 5. Thus, ballasting resistor 40 allows for the use of a broader range of implementation of the control circuit 93.

The subtlety of the invention is best expressed in a more formal mathematical setting. One common representation of a battery is that of a voltage source in series with resistor. Both the resistance and the voltage source are functions of many parameters. For purpose of the analysis the resistance is considered to be a function of a single variable: the state of charge. Thus:

$$\text{Battery resistance} = R_{bat}(\%charge)$$

The battery voltage is considered to be a function of state of its charge and of the average of the charging current consequently:

$$\text{Battery equivalent source voltage} = V_{bat}(\%charge, I_{charge}).$$

As illustrated in FIG. 3 the battery is charged at a fast rate until the high voltage set point of the control circuit is reached. At that time, the battery has reached a substantial charge level and its resistance from that moment on can be approximated by a constant number: $R_b = R_{bat}(100\%)$. Defining, $R_s = R_{40} + R_{stray}$ where R40 is the resistance of 40 and Rstray is any other resistance in series between the current source and the battery, the voltage at the output of the current source is:

$$V_o(ON) = V_{bat}(\%charge, I_{charge}) + (R_s + R_b)*I_s$$

$$V_o(OFF) = V_{bat}(\%charge, I_{charge})$$

where Is is the output current of 92.

Defining the Duty Ratio D as the ratio of the ON time to the sum of the ON and the OFF time, the average output current is expressed as:

$$I_{charge} = D*I_s$$

Thus, the average current delivered to the battery can be found by solving for D. The following function is defined:

$$\text{Battery voltage that would yield } D = V_b(D)$$

To solve for the Vb(D), the high and low voltage set points are defined as Vsh and Vsl respectively. Prior to reaching 80 the duty ratio is full. Modulation of the current source thus starts when:

$$V_b(D=1) = V_{sh} - (R_s + R_b)*I_s$$

It is also clear that if Vb(D) (211) was to reach a level equal to the low voltage set point modulation would stop thus:

$$V_b(D=0) = V_{sl}$$

Figure 9:
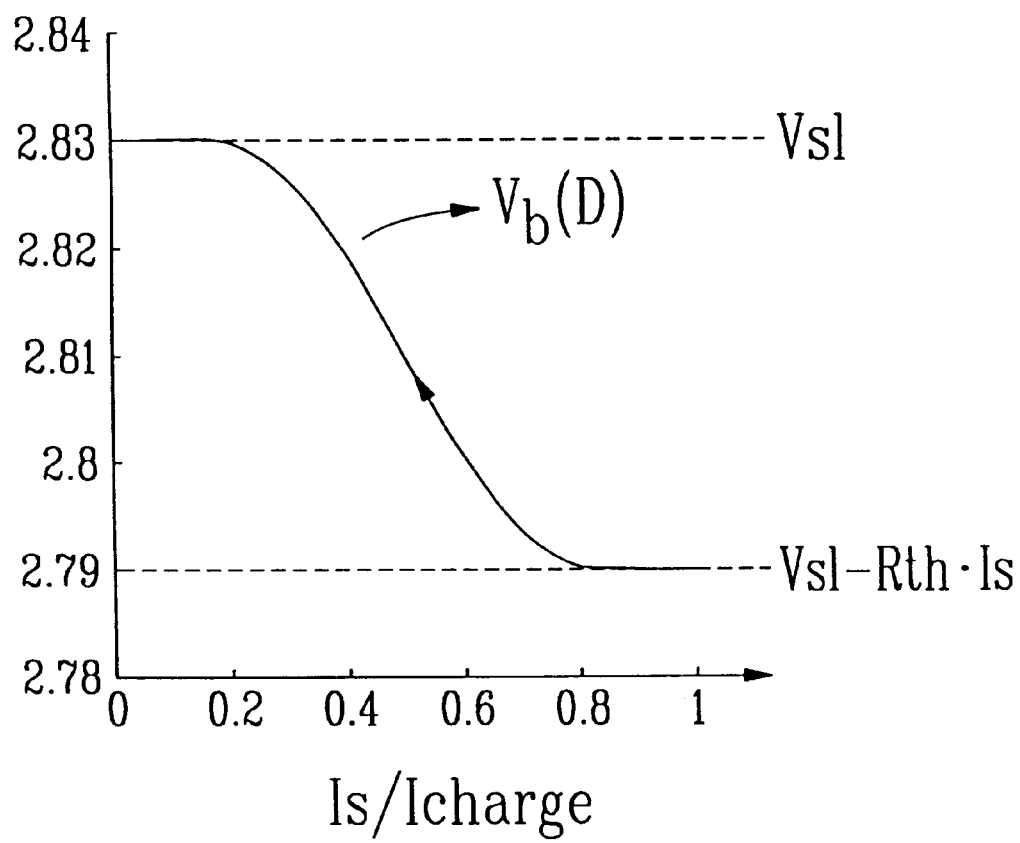
FIG. 9 is a graph of the voltage level to the output current of a current source.

Solving for intermediate points is slightly more difficult. The invention uses a hysterisis comparator with first order low pass filtering. One can solve steady state differential equations to obtain the desired function. Such a function is illustrated in FIG. 9. The X-axis is scaled from zero to 1 as a duty ratio axis and is also scaled from zero to Is to as an average charging current axis. The taper charge period which starts at 80 with D=1, proceeds from right to left on FIG. 9.

Thus as seen at the terminals of the battery equivalent voltage source Vbat(% charge,Icharge), the voltage control circuit 93 and all series resistances thus convert the current source 92 into a second voltage source with open circuit voltage of:

$$V_{open} = V_{sl}$$

The output impedance of this voltage source is non linear, but can be recognized to be a function of the parameter:

$$Rth = (Rs + Rb) - \frac{Vsh - Vsl}{Is}$$

Which allows one to rewrite Vb (D=I) as:

$$Vb\ (D{=}I){=}Vsl{-}Rth{\cdot}Is$$

To completely describe the charging process final voltage of the battery must be determined. The equivalent battery voltage for a fully charged battery is obtained from the Tafel curves given by battery manufacturers and from the following equation:

$$Vbat(full, Icharge) = VTafel(Icharge) - Rb*Icharge \qquad \mathrm{I}$$

Figure 10:
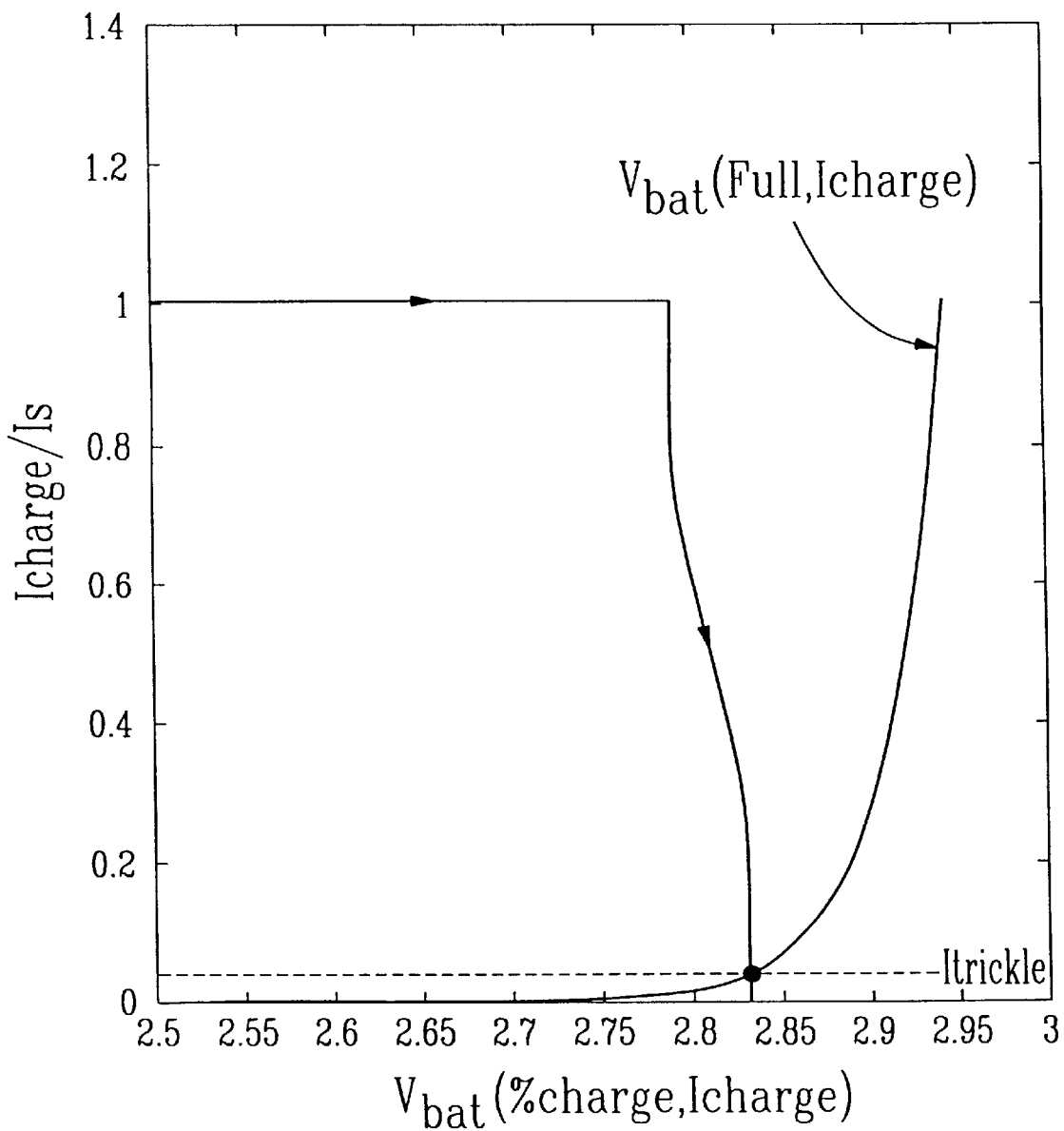
FIG. 10 is a graph of charging current to the battery voltage.

Using the information that the charging current is equal to Is prior to 80 and the information from FIG. 9, the charger current/voltage characteristic is plotted on FIG. 10. The fully charged battery current/voltage characteristic obtained from equation I is also plotted on FIG. 10. The charging current will proceed from left to right on the charger characteristic line and will stabilize at the trickle current given by the intersection of the two characteristic curves. FIG. 10 illustrates the essence of the invention; thus, with a single voltage comparator one can control a current source to: 1.) Deliver fast charge current to a battery, 2.) Terminate fast charge using a voltage sensing mechanism, 3.) Fully charge the battery, 4.) Limit the trickle current to an acceptable value, and 5.) Maintain the power supply in operation to obtain a visual indication.

Another advantage of the invention is that after reaching the cutoff voltage Vsl it does not revert immediately to the trickle charge current but goes through a taper period, thus reaching full charge of the battery more quickly.

Actual selection of Vsh, Vsl, Is and the value of 40 are parameters that one skilled in the art can freely select. Two governing factors in this selection are the inequality $$Vbat(full, Is) > Vsh - (R40 + Rstray + Rb)*Is \qquad \mathrm{II}$$

and the ratio $$Ratio = \frac{(R40 + Rstray + Rb)*Is}{Vsh - Vsl} \qquad \mathrm{III}$$

To guarantee the operation depicted in FIG. 3 this ratio must be larger than unity otherwise operation similar to that of FIG. 1 will result. If one wishes to design the system to maximize the time spent in fast charge, the ratio must be as close as possible to unity. Rb is not a parameter guaranteed by battery manufacturer and Rstray may vary especially when the battery interconnection resistance is not well controlled. Setting 40 to a known value will therefore minimize the variation in the ratio that would result from variations in Rb and Rstray. Equation II is the criteria for guaranteed termination of fast charge. Setting 40 to a known value has a similar stabilizing effect on equation II as on equation III.

Figure 11:
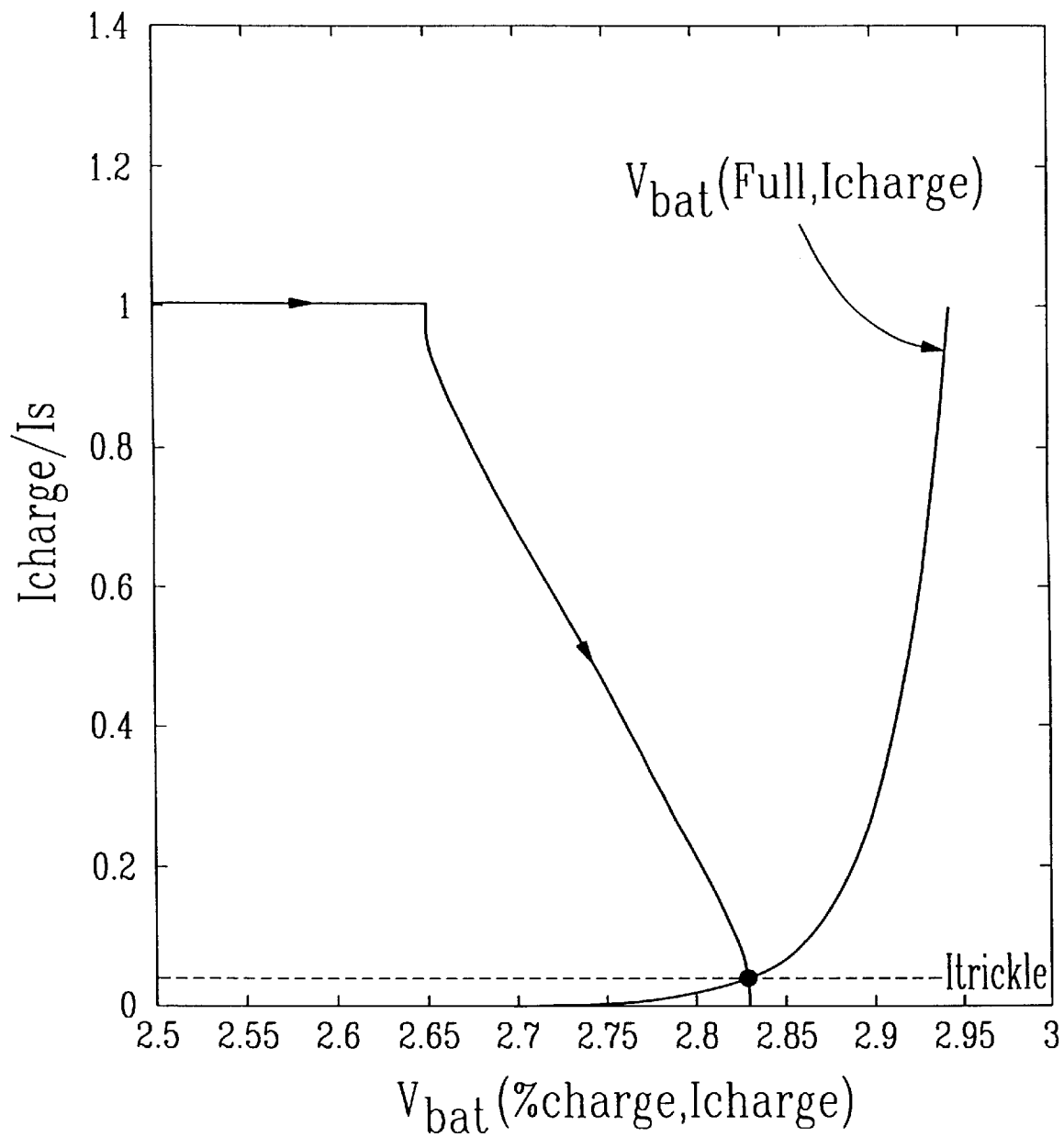
FIG. 11 is another graph of charging current to the battery voltage

On the other hand one may wish to obtain a more conservative design, as that illustrated in FIG. 11. This type of optimisation ensures that the trickle current always remains below a certain limit especially in expectation of variation of the battery voltage at the end of its life. The characteristic illustrated in FIG. 11 is obtained by selecting a value of ratio larger than unity. Obtaining a high ratio without the addition of 40 would imply that the difference between Vsh and Vsl should be small. Obtaining a small and predictable difference between the two set points would not be possible with the simple, economical, able to function at low supply voltage and temperature compensated comparator described elsewhere in this text. Should the difference be unpredictable so would be the ratio. The pulse periods illustrated in FIG. 3 would also be unpredictable and would affect the performance for both implementation of the visual display discussed elsewhere in the text.

One could actually select 40 to be of zero value, but its addition allows the obtaining of predictable and more reliable behavior when using the simple, inexpensive and compact implementation of the voltage comparator and the current source which this invention provides.

Figure 7:
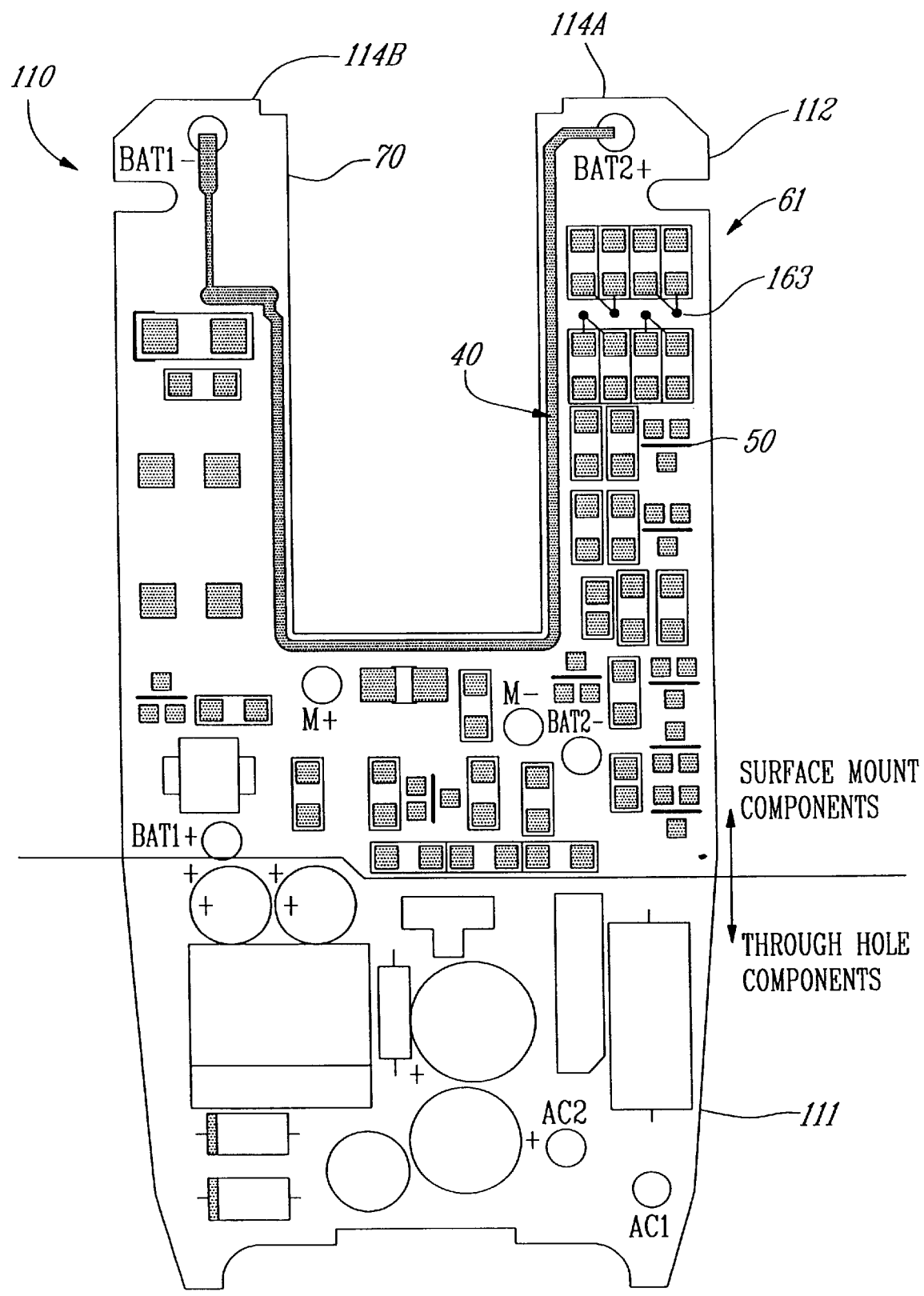
FIG. 7 is a depiction of the layout of a printed circuit board which would use the present invention.

In the preferred embodiment of the present invention, ballasting or compensating resistor 40, in fact, is a long metal strip 40 as depicted in FIG. 7. Resistor 40 is implanted on a circuit board 110. As depicted in FIG. 7, the strip which is resistor 40 runs between the terminals of the batteries. As can be easily conceived by those skilled in the art, strip 40 has been given the appropriate thickness and composition to allow it to act approximately as a 100 milli-Ohm resistor as implemented in the preferred embodiment. 100 milli-Ohm resistors are generally fairly expensive and, in fact, the strip 40 which has been substituted as a 100 milli-Ohm resistor provides an extremely cheap and easily fabricated resistor from a manufacturing point of view.

B. Constant Current Source

In order for the system of the present invention to operate properly, it needs a reliable and constant current source. Those skilled in the art will readily appreciate that a number of options exist which can provide a constant current source to achieve the desired results of the present invention. However, given the particular objectives of the present invention, what in part is needed is a rugged current supply, which is easy to fabricate, easy to turn OFF and ON and can produce a constant current of up to 0.9 to 1.2 amperes if not more. Thus, the preferred embodiment of the present invention builds the current supply around a MOSFET.

Figure 5:
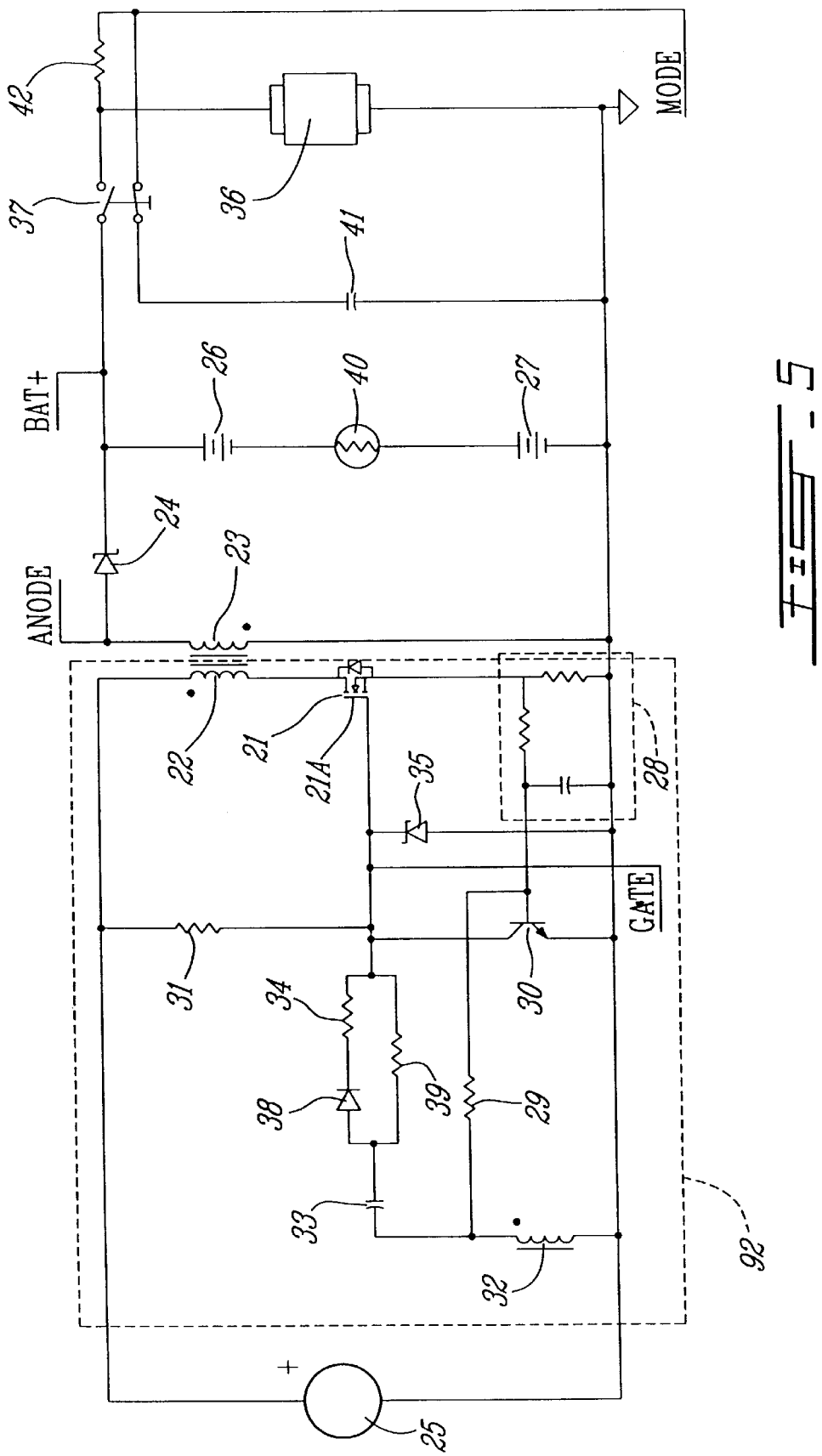
FIG. 5 is a detailed schematic diagram of the discrete electrical components which make up the power supply and battery portion of the present invention.

Referring to FIG. 5 power MOSFET transistor 21 in combination with windings 22 and 23 and Schottky diode 24 is used to transfer energy from the input voltage source 25 to the two battery cells 26 and 27. Current sense network 28 in combination with gate-drive transistor 30 ensures that the rate of transfer of energy is limited.

The operation of the power supply is of the astable type and is described as follows. When input voltage 25 is applied, resistor 31 provides current to the gate 21A of transistor 21. When the threshold voltage of gate 21A is reached transistor 21 turns on. This provides voltage across winding 32 and energy is transferred to gate 21A of transistor 21 to complete the turn on process. Capacitor 33 limits the amount of energy delivered to the gate circuitry whereas resistor 34 limits the rate at which said energy is delivered. Zener diode 35 limits the voltage across the gate 21A of transistor 21. While transistor 21 is on, energy is stored in winding 22 and current increases linearly as a function of time. When the voltage across current sense network 28 is sufficient, gate-drive transistor 30 will turn off transistor 21 and energy will be delivered to battery cells 26 and 27 through winding 23 and Schottky diode 24. When all of the energy contained in winding 23 is depleted, windings 22, 23 and 32 will resonate with the self-capacitance of the power MOSFET, transistor 21, and of the Schottky diode 24. This will provide voltage at the gate of 21A of transistor 21 in excess of its voltage threshold and transistor 21 will turn ON again in a much shorter time than would be required to turn ON by the action of resistor 31 alone.

Those skilled in the art will readily recognize an implementation of a self-oscillating flyback converter with constant peak current. Those skilled in the art will also recognize that, by proper selection of the turn ratio, the ON time of transistor 21 can be made generally much shorter than its OFF time for an intended input and output voltage combination of ranges. Thus, for the given ranges of input and output voltage, the output current of the flyback converter can be made to be relatively constant. In addition, resistor 29 is used to reduce the peak current circulating in winding 22 as input voltage is increased. This yields nearly constant output current over a wider input voltage range.

The output current for zero output voltage, assuming Shottky diode 24 is an ideal diode, is thus easily calculated to be 0.5 times the peak current delivered by winding 23. The output current of the flyback converter appears to be inherently limited. Short-circuit current is thus restricted to a value smaller than the maximum theoretical limit. This upper bound is calculated assuming transistor 21 remains off until the energy in winding 23 is completely discharged before transistor 21 turns on again. Unfortunately, since the time required to discharge the energy in winding 23 is inversely proportional to the voltage applied across it, the discharged time and overload conditions will be much longer than under normal operating conditions. Since start-up resistor 31 always provides current to the gate 21A, transistor 21 will again turn ON before the energy of winding 23 is completely discharged. This will result in an accumulation of energy in the power supply that would result in either excessive output current or in failure of transistor 21. One instance of low output voltage can occur in the intended application as follows, the power supply and the battery cells are intended to supply current to DC motor 36 through the use of switch 37. Preventing rotation of the rotor by any means would result in such a low output voltage.

To solve the preceding problem, which is essentially an overload condition, the invention increases the time required for resistor 31 to turn on transistor 21 again. The invention accomplishes this by adding diode 38 and resistor 39 to the circuit. Thus, when transistor 21 is OFF, diode 38 prevents capacitor 33 from discharging through resistor 34. The discharging current must flow through resistor 39 which is of a much larger value than resistor 34. This current circulates in zener diode 35 and keeps the gate voltage of transistor 21 at a negative voltage for as long as this current exceeds the current supplied by resistor 31. This effectively extends the time which transistor 21 is maintained in an OFF state thus limiting the output current under low output voltage conditions.

C. The Voltage Controlled Circuit

One of the key components of the preferred embodiment of the present invention is the voltage controlled circuit. It monitors the voltage levels of the batteries and compares it to its high and low set points and in response controls the current source by turning it ON and OFF at the appropriate time. This, in conjunction with the ballasting resistor 40, in effect turns the constant current source into a voltage as described above.

Figure 6:
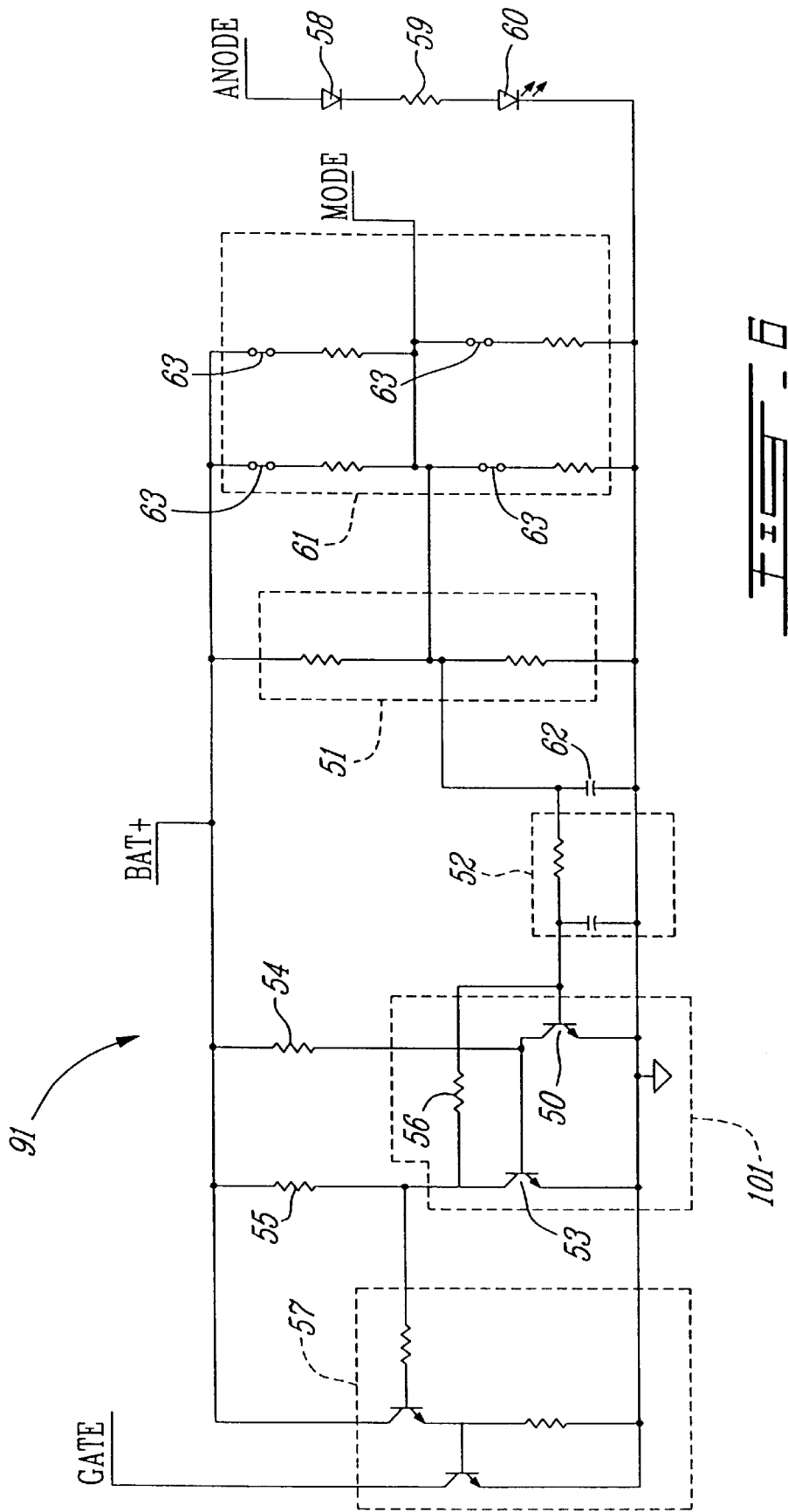
FIG. 6 is a detailed schematic diagram of the discrete electrical components which make up the voltage control section of the present invention.

In the preferred embodiment, voltage regulation is achieved by means illustrated on FIG. 6. Battery voltage is fed back to transistor 50 through resistive divider 51 and high frequency buffer 52. The magnitude of the battery voltage will thus determine the "on" or "off" state of transistor 50. In order for the battery voltage level to accomplish this transition and also be easily predictable, transistor 50 is connected to transistor 53 and resistor 54. The collector current and collector voltage of transistor 50 are thus well defined. The base voltage of transistor 50 for which a transition from ON to OFF or from OFF to ON occurs can easily be determined as the operating point for transistor 50 is well defined. Unlike the circuit of FIG. 1 which has a number of components with wide tolerances, the invention only has one parameter with wide tolerance, the base-emitter voltage of transistor 50. Consequently, the use of this regulation circuit in conjunction with resistor 40 results in a product for which most of the manufactured units will not require trimming, a significant improvement over the approach of FIG. 1 where 100% of the manufactured units must be trimmed.

Transistors 50 and 53 form a open collector voltage comparator 101 with pull-up resistor 55. Thus, the structure of FIG. 6 also has the following inherent advantage in that the relation between the high and low voltage set points are easily programmed by means of resistor 56. The lower set point is set at the voltage at which the average battery voltage is expected to rest when the battery is fully charged. High and low set points are selected as described above.

The output of the comparator 101 is transmitted to the gate of transistor 21 through buffer 57. The resulting operation is illustrated in FIGS. 3a and 3b. When recharging a fully discharged battery, the power supply will first be continuously on, as the battery voltage plus the voltage drop across the series resistance is lower than the high voltage set point. The power supply is actually delivering pulses of energy at a high frequency but can be considered to be continuously delivering an average current equal to the power supply current rating and thus acts as the current source 92. The current source is thus ON and the voltage across the battery and resistor 40 will rise until the high voltage threshold is reached at which point the current source will then be turned off. When the voltage falls below the low threshold the current source is turned on again by charging circuit 91. As the battery is being recharged, the time spent in the OFF mode increases, and the time spent in the ON mode becomes smaller. The effective current delivered to the battery tapers down from a fast charge rate to trickle rate.

D. Visual Display

The present invention utilizes the ON-OFF behavior of the charging circuit as illustrated in FIG. 3a and 3b to generate an indication of the status of the charging process. In the preferred embodiment, diode 58 resistor 59 and light-emitting-diode 60 are attached to the anode of diode 24 of FIG. 5. Whenever the current source is on, LED 60 will emit light. Referring to FIG. 3a, the LED will be continuously on at the beginning of the charging cycle, when the battery is in a discharged state. At 83 it will start flashing at a high rate and slow down progressively during the charging. When it is fully charged the LED will blink on from time to time.

However, the circuitry must be enhanced to produce current pulses which will provide a visible indication of the charging status at all times during the charging process. Otherwise, the light-emitting diode will become progressively less bright and cease to give any apparent indication of the status in the latter half of the charging process. Components have to be added to broaden out the current pulses and make them visible near the end of the charging cycle. This objective of the preferred embodiment is achieved by the addition of appropriate valued capacitors 41 of FIG. 5 and 62 of FIG. 6. The timing sequence of the current pulses given appropriately valued capacitors 41 and 62 can produce a visible indication during the entire charging process It will be appreciated that the rate of flashing of the LED indicator source is determined in the preferred embodiment by the cycle period of the voltage controlled circuit. In the embodiment described above, the cycle period is sufficiently long such that the cycle period can be detected by the human eye as a blinking in the LED 60. By increasing the frequency of the cycle, for example by reducing a capacitance of capacitor 41, the blinking rate may become sufficiently high as to appear to the human eye as a constant ON. In this case, the apparent intensity of the LED 60 would be at full intensity when the duty cycle is at its maximum, and the LED 60 would be at a minimum intensity when the duty cycle was at its minimum, i.e. it may even appear to be totally off. Of course, during the taper region of the charging cycle, the LED 60 would appear to be at a medium level of intensity. It will be appreciated that the LED can be powered by an inverter receiving the control signal so as to provide an indication of the degree of charge in the battery during use to drive a load, as opposed to the rate of charging.

Thus the type of signal displayed by the visual indicator can be varied from a perceptible flashing light to one which only varies in intensity. Additionally, an inverter could be added to the circuit which would add the alternative of a signal increasing in intensity or flashing rate as the battery is charged. Those skilled in the art will also appreciate that to make the flashing visually perceptible the flash rate must be reduced to less than 20 flashes a second preferably less than 16 a second. On the other hand to assure that the only change visible is the intensity of the light the flash rate must be at least 24 times a second or more.

In a further aspect of the method of this invention two or more different light sources can be provided, the apparent intensity of which can be varied to form different colors of uniform hue on an appropriately configured visual display, such as light mixing and diffusing light pipe. The invention can also provide a variable color indicator comprising a light mixing and diffusing apparatus, such as a light pipe and two different color light sources arranged to direct light at the entrance window of the light pipe, and a circuit controlling the intensity of the light sources to produce a desired color on the exit surface of the light pipe in response to a variable color control signal. Preferably, the light sources comprises LED's and the circuit comprises a pulse width modulated (PWM) intensity signal for powering a first LED and an inverter for inverting the PWM intensity signal for powering the second LED.

In its preferred implementation the battery charger can also act as a voltage source to DC motor 36. In order to achieve this dual mode, capacitor 41 is taken out of the circuit to allow for rapid changes between the OFF and ON state of the current source. Voltage being present at the DC motor terminal, voltage will be fed to transistor 50 through resistor 42 and will modify the comparator voltage set point. Thus when a battery is so discharged that it cannot sustain the appropriate voltage across the motor, the current source will.

E. Circuit Fabrication and Layout

The preferred embodiment is assembled on a printed circuit board (PCB) 110 shown on FIG. 7. To facilitate manufacturing and avoid complicating the manufacturing process, all through hole components are mounted on a lower section 111 of the board as depicted in FIG. 7. All surface mount components are mounted on a top section 112 of the board. The two sections 111 and 112 do not overlap. Consequently, surface mount section 112 can be assembled using reflow techniques whereas the through hole section 111 can be soldered using wave technique. Production yields can therefore be greatly enhanced. As noted, resistor 40 would normally be difficult to obtain as a surface mount component. The present invention as noted above solves this problem by fabricating resistor 40 as a track printed on the circuit board and illustrated in FIG. 7. The circuit layout on PCB 110 of the preferred embodiment of the present invention as depicted in FIG. 7 has additional features which will be explained below.

F. Adjusting for Negative Temperature Coefficients of the Battery

The present invention also deals with the negative temperature coefficient characteristic of batteries. This particular problem can easily introduce errors and problems into the charging process and damage the battery when voltage sensing is used to charge the battery.

The present invention in part accounts for this problem by positioning the key transistor 50, which itself has a negative temperature coefficient, adjacent to the battery, see FIG. 7. Transistor 50, which is the key transistor in the comparator circuitry 101, see FIG. 6, then heats up along with the battery. Accordingly, the setting of transistor 50 changes in step with the batterie's negative temperature coefficient and thus compensate for the errors introduced by the negative temperature coefficient of the battery.

More specifically, a typical battery generally has a negative voltage coefficient; thus, when the battery heats up, its voltage will decrease. For a typical voltage regulator, this will result in an increased current and in turn additional heating and eventually thermal runaway which can seriously damage or destroy a battery. A 2 cell battery has a coefficient of approximately $-5$ mV/° C. A base emitter voltage of a NPN transistor has a voltage of approximately 0.6 V and a temperature coefficient of approximately $-2$ mV/° C. If a base-emitter voltage is used as a voltage reference to regulate the battery at 2.85V, the resulting regulator temperature coefficient will be approximately $-9$ mV/° C. Consequently, if the battery and the transistor are in close thermal contact, the voltage regulator will behave as a temperature compensator and will prevent thermal runaway should the voltage set point of the regulator be set slightly higher than the battery voltage. In the preferred embodiment of the invention, battery cells are mounted on the top side of the PC board on each of the two legs 114A and 114B of the PC board. Transistor 50 is thus strategically mounted underneath one of the two battery cells as illustrated in FIG. 7.

Making resistor 40 out of a printed circuit board trace also contributes to temperature compensation. PCB traces are made out of copper and have positive temperature coefficient. Locating resistor 40 in close thermal contact with the batteries, as illustrated on FIG. 7, causes resistor 40 to increase its resistance should the battery cell heat up. For example if the current source amplitude is 1.3 Amp and resistor 40 is 0.1 ohm at 25° C. then a 20° C. rise in temperature would generate an extra 10 mV drop thus contribute to temperature compensation.

G. Fine Tuning the Voltage Controlled Circuit

Trimming generally entails the removal or disconnecting of specific circuit elements from a circuit to adjust the tolerances of the circuit. Quite often trimming involves the disconnecting of resistance from the circuit which has been specifically included for this purpose. As noted above, one of the advantages of the present invention is that it requires little or no trimming to adjust the circuit during the manufacturing process to provide for appropriate tolerances so that the invention operates properly. This is in contrast to the circuit of FIG. 1 where generally trimming has to be done all the time to adjust for variations inherent in the circuitry components. The present invention, in its preferred embodiment, limits the adjustment to only once if at all necessary.

More specifically, the base-emitter voltage of a transistor, such as 50, has a statistical distribution which is wide. The resistor networks 51 and 61 FIG. 6 which are used to scale the battery voltage down to the base-emitter voltage also have a statistical distribution of possible values. This results in a statistical distribution of regulator set points which sometimes exceed that which is acceptable to charge the battery. Although, the present invention has significantly minimized the need for trimming to adjust the voltage set points some adjustment may be necessary from time to time; thus, means must still be available provide for such adjustments when the need arises. Voltage adjustment can be performed by removal of one or more of the resistors of the voltage adjustment network 61 (see FIGS. 6 and 7). Manual removal of surface mount resistors similar to that depicted in FIG. 1 is time consuming and therefore costly. To avoid these problems, the present invention not only reduces the number of trim procedures to one at most, it also provides a means to fully automate the trimming procedure when it is necessary. The present invention achieves this result by providing cutting guides which amount to holes or apertures 63 on the PCB in the conducting lines which connect a potential item to be trimmed to the a circuit on the board. These apertures are positioned to guide an automated drill bit as it drills into the board in the process of severing a component, such as a resistor from a circuit.

Figure 8:
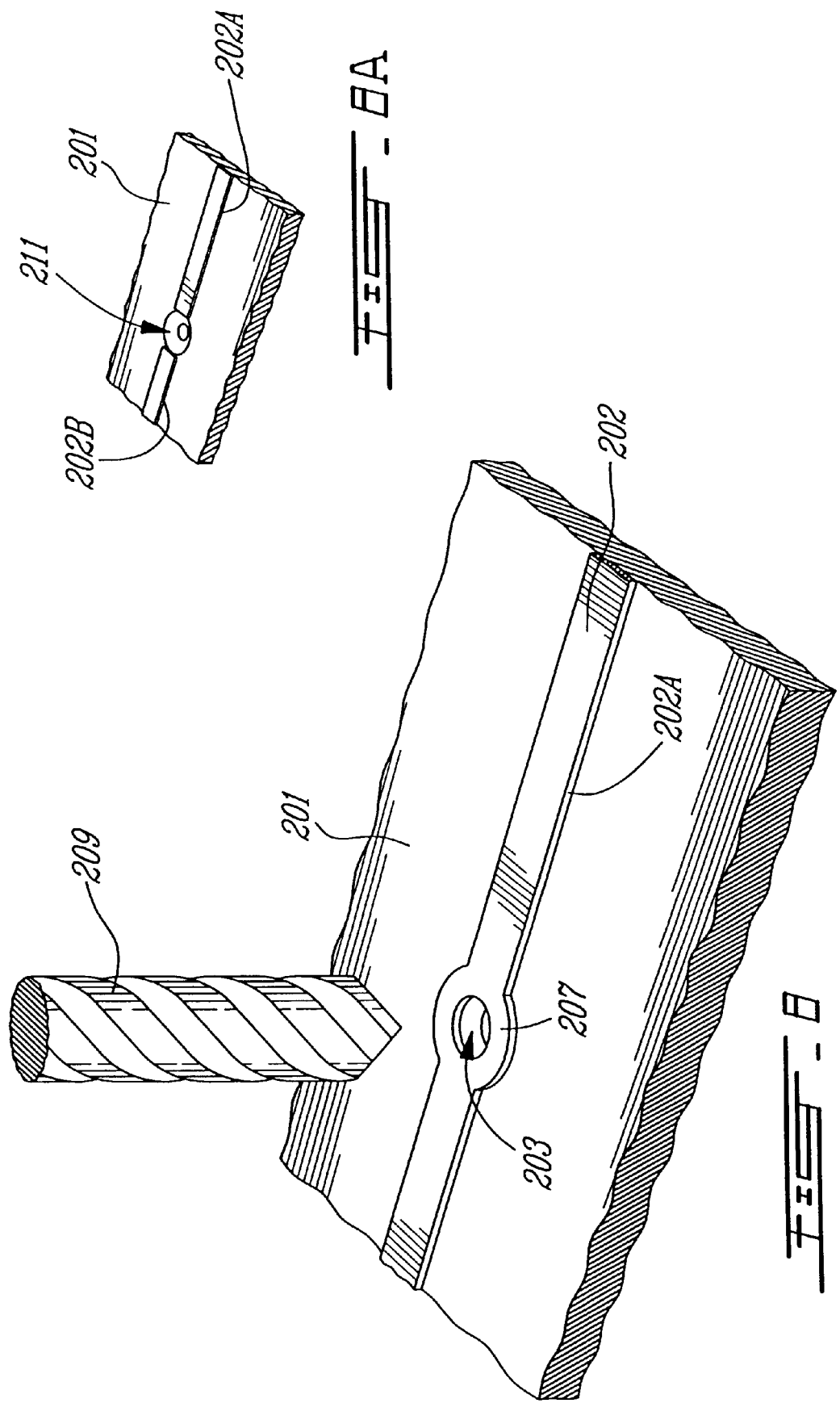
FIG. 8 provides a view of a portion of a PCB with a trimming aperture.

The conductive trimming guides depicted schematically as 63 of FIG. 6 are shown in FIG. 7 as 163. FIG. 8 provides a magnified view of one conductive trimming guide consisting of conducting material 207 and aperture 203. The aperture 203 located on PCB 201 lies in conducting script 202. In fact a portion 207 of conducting strip 202 surrounds the aperture 203. Generally, conducting strip 202 including the portion 207 surrounding the aperture 203 are made of a conducting a material such as copper.

A tip of a drill 209 is depicted poised above aperture 203. The drill bit 209 has a diameter greater than the combining the diameter of aperture 203 and the surrounding conductive material 207. The drill bit 209 is direct towards the center of the aperture 203. Thus, when rotating drill bit 209 reaches it aperture 203 guides the drill as it cuts into PCB 201. After making of the cut into PCB 201 and being retracted the drill bit 209 leaves a clean cut hole 211 as depicted in FIG. 8a. Since the cut by the drill bit 209 leaves a hole 211 with a larger diameter than that of the original aperture 203 and the surrounding conductive material 207 a clean cut of the conducting strip 202 had been made. The complete removal of all of the conducting material 207 surrounding aperture 203 severs conducting strip 202 into two unconnected parts 202a and 202b. Consequently, any components connected into a circuit by conducting strip 202 are severed from the circuit.

Since those skilled in the art are fully familiar with the the standard procedures for fabricating PCB's a detailed discussion herein is not necessary. Suffice it to say that the typical PCB is manufactured from a fiberglass or similar sheet of non-conductive material. A layer of conductive material is then deposited over one side of the PCB. This conductive material generally is copper; however, silver, aluminum or gold are among other possible choices depending upon the application.

Holes to mount of the components are made in the board. Additionally, at this time the apertures 203 which will form part of the conducting trimming guides can be made in the board. In fact the same drills used to form the holes used to secure the through hole components could drill the holes for the apertures. The copper or other conducting material deposited on the board is then etched in the standard fashion. The etching removes most of the conducting material leaving only an intricate network of conducting strips which will electrically connect the components to be mounted on the board. Generally, given the very stringent tolerance requirements for manufacturing a PCB, fabrication of the apertures is easily included. Thus, the automated trimming can be done under more imprecise machining conditions during the PCB test phase after the addition of the components. Also, the apertures allow for a manual cutting with a drill held by a person which still would retain the precision necessary to avoid gross mistakes.

While the invention has been particularly shown and described with reference to a preferred embodiment thereof, it will be understood by those skilled in the art that various changes in form and detail may be made to it without departing from the spirit and scope of the invention.

What is claimed is:

1. A current source of the astable type for limiting an output current under overload conditions, said current source including a power MOSFET, wherein:

said power MOSFET has:
  a drain connected to a first terminal of a primary winding of a transformer;
  a source connected to a first connector of a current sense network; and
  a gate connected to a cathode of a Zener diode, a first terminal of a trigger resistor, a first connector of an energy transfer limiting network and a collector of a bipolar npn transistor;
the trigger resistor has a second terminal connected to a second terminal of the primary winding the transformer and an anode of a voltage source;
the voltage source has a cathode connected to a first terminal of a single winding, an emitter of the bipolar npn transistor, a second connector of the current sense network and an anode of the Zener diode;
the single winding has a second terminal which connects to a second connector of the energy transfer limiting network, a first terminal of an input voltage compensation resistor;
the input voltage compensation resistor has a second terminal which connects to the base of the bipolar npn transistor and to a third connector of the current sense network;
a secondary winding of the transformer has a first terminal connected to an anode of a Schottky diode;
wherein the said energy transfer limiting network includes a capacitor with a first terminal which forms the second connector of the energy transfer limiting network and a second terminal which attaches it to a first terminal of the diode, and the diode has a second terminal attached to a first terminal which attaches to both the first terminal of the diode and the second terminal of the capacitor and a second terminal which attaches to a second terminal of the resistor which connection forms the first connector of the energy transfer limiting network, whereby the energy transfer limiting network limits the amount of energy delivered to the gate circuitry and also reduces the transfer of energy from the primary of the transformer to its secondary under overload conditions; and wherein the current sense network has a first and second resistor and a capacitor, the first and second resistor each have a first terminal which attach to each other and form the first connector of the current sense network; the capacitor has a first terminal which attaches to a second terminal of the first resistor, which form together the second connector of the current sensing network; and the capacitor has a second terminal which attaches to a second terminal of the second resistor which form together the third connector of the current sense network.

* * * * *